United States Patent
Maichl et al.

(10) Patent No.: US 6,747,400 B2
(45) Date of Patent: Jun. 8, 2004

(54) PIEZOELECTRIC FLEXURAL TRANSDUCER AND USE THEREOF

(75) Inventors: Martin Maichl, Salach (DE); Markus Hoffmann, Wolfschlugen (DE); Michael Weinmann, Plüderhausen (DE); Michael Riedel, Rödental (DE); Karl Lubitz, Ottobrunn (DE); Andreas Schmid, Michelau (DE)

(73) Assignees: Festo AG & Co., Esslingen (DE); Siemens AG, Munich (DE)

( * ) Notice: Subject to any disclaimer, the term of this patent is extended or adjusted under 35 U.S.C. 154(b) by 0 days.

(21) Appl. No.: 10/258,043

(22) PCT Filed: May 10, 2001

(86) PCT No.: PCT/EP01/05321
§ 371 (c)(1),
(2), (4) Date: May 12, 2003

(87) PCT Pub. No.: WO01/89003
PCT Pub. Date: Nov. 22, 2001

(65) Prior Publication Data
US 2003/0168941 A1 Sep. 11, 2003

(30) Foreign Application Priority Data
May 15, 2000 (DE) ......................................... 100 23 310

(51) Int. Cl.⁷ ............................................. H01L 41/08
(52) U.S. Cl. ........................ 310/332; 310/330; 310/340
(58) Field of Search ................................ 310/330–332, 310/340

(56) References Cited

U.S. PATENT DOCUMENTS

| 2,524,579 A | * | 10/1950 | Taylor ........................ 310/330 |
| 4,330,730 A | | 5/1982 | Kurz et al. .................. 310/331 |
| 4,585,970 A | * | 4/1986 | Koal et al. .................. 310/331 |
| 5,775,715 A | * | 7/1998 | Vandergrift .................. 280/602 |
| 6,024,340 A | | 2/2000 | Lazarus et al. ......... 251/129.06 |
| 6,042,345 A | * | 3/2000 | Bishop et al. .............. 417/322 |
| 6,316,865 B1 | | 11/2001 | Riedel ........................ 310/332 |

FOREIGN PATENT DOCUMENTS

| DE | 4410153 C1 | 2/1995 | ............ F16K/31/02 |
| DE | 19742294 A1 | 4/1999 | ............ B06B/3/00 |
| WO | WO 98/37343 | 8/1998 | |
| WO | WO 99/17383 | 4/1999 | ............ H01L/41/09 |
| WO | WO 99/25033 | 5/1999 | ............ H01L/41/09 |

* cited by examiner

Primary Examiner—Thomas M. Dougherty
(74) Attorney, Agent, or Firm—Hoffmann & Baron, LLP

(57) ABSTRACT

A piezoelectric flexural transducer having an elongated support body (2) which on at least one longitudinal side is provided with a piezoelectric unit (5). The piezoelectric unit (5) has one or more piezoelectric material layers (12) and electrodes (13a and 13b) associated with same. Furthermore, the piezoelectric unit (5) includes an electrically insulating coating surrounding the body (8) right round it, the section (26) of the coatings lying between the piezoelectric body (8) and the support body (2) being provided with one or more electrically conductive vias (27a and 27b). The latter provide the necessary electrical connection between the electrodes (13a and 13b) and the support body (2).

19 Claims, 2 Drawing Sheets

PIEZOELECTRIC FLEXURAL TRANSDUCER AND USE THEREOF

FIELD OF THE INVENTION

The invention relates to a piezoelectric flexural transducer comprising an elongated support body which on at least one longitudinal side is fitted with a piezoelectric unit, which has a piezoelectric body with one or more piezoelectric material layers and electrodes associated with same, the electrodes being connected in an electrically conducting manner with the support body. Furthermore, the invention relates to use of such a piezoelectric flexural transducer.

BACKGROUND OF THE INVENTION

A prior art piezoelectric flexural transducer of this type in accordance with the patent publication WO 99/17383 possesses an elongated support body, which at opposite longitudinal sides is fitted with a respective piezoelectric unit. The piezoelectric unit comprises a piezoelectric body manufactured using multi-layer technology and possessing a plurality of piezoelectric material layers and electrodes associated with same. By the application of a drive voltage to the electrodes electric fields may be produced in the piezoelectric body, this causing a longitudinal contraction of the piezoelectric body and furthermore a deflection, comparable with a pivoting motion, of the piezoelectric flexural transducer in relation to the position at which the piezoelectric flexural transducer is held. In order to be able to apply the drive voltage to the electrodes of a respective piezoelectric unit are in electrical contact with the support body, which is able to be connected with a source of voltage.

During operation of such known flexural transducers moisture may engender problems. If the piezoelectric flexural transducer is for example employed as the setting member of a valve for controlling fluid flow, and is at all times surrounded by pressure medium containing moisture, it is possible for partial short circuits to occur, which impair the deflection characteristics of the piezoelectric flexural transducer and the functional reliability of the means fitted with the piezoelectric flexural transducer.

SUMMARY OF THE INVENTION

One object of the present invention is to provide a piezoelectric flexural transducer of the type initially mentioned which while allowing simple manufacture is not sensitive to external effects and more particularly is insensitive to moisture. A further aim resides in the use of such a piezoelectric flexural transducer.

The first mentioned object is to be attained by a piezoelectric flexural transducer of the type initially mentioned in the case of which the piezoelectric unit comprises an electrically insulating coating surrounding and encasing the piezoelectric body, such coating being provided with one or more electrically vias for making electrical contact with the electrodes.

It is in this manner that the invention provides a piezoelectric flexural transducer, in the case of which the piezoelectric body having the electrodes is completely encapsulated by the electrically insulating coating surrounding it and is screened off from the outside. The piezoelectric body and its component parts are therefore protected against external influences and functional impairment such as that due to moisture, is not possible. For the application of the drive voltage the piezoelectric unit is consequently provided, in accordance with its particular design, with one or more electrically conductive vias extending through the coating.

It would in principle be possible to provide the entire piezoelectric flexural transducer with a uniform coating. However, the separate coating of one or more already existing piezoelectric units independently of the support body has substantial advantages both from the point of view of manufacturing technology and also as regards costs. The vias can produce the electrically conductive connection between the electrodes of the piezoelectric material and the conductors of the support body or lead to electrodes on other outer sides of the piezoelectric material.

Further advantageous developments of the invention are defined in the dependent claims.

It is convenient for the vias to be located in the section of the coating, facing the support body, so that on the application of a piezoelectric unit to the support body electrical contact between a respective piezoelectric unit and the support body is made simultaneously. Furthermore, the adhesive layer normally present between the piezoelectric unit and the support body and serving for securing the piezoelectric unit may reliably seal off the surrounding part of the vias from the outside.

At each respective via the support body preferably possesses an electrically conductive contact face connected with the via. It is also an advantage for each electrically conductive via to be provided with a contact layer on the outer face (which faces the support body) of the section, which rests on the support body, of the coating, such layer serving to make contact with the support body. It may be made with a sufficiently large periphery so that no complex adjustment work is necessary for mounting the piezoelectric unit with a reliable and secure contact making effect.

The structure in accordance with the invention is also advantageous even when the piezoelectric body has only one piezoelectric material layer, that is to say is made in the form of a monolithic piezoelectric body. Owing to the plurality of electrodes present such structure is however particularly to be recommended in the case of a multi-layer piezoelectric body with a plurality of piezoelectric material layers.

As a material for the electrically insulating coating it is preferred to employ a parylene (generic term for thermoplastic polymer films, which are formed from p-xylene) or a polyimide (generic term for high temperature stable plastics, which generally contain aromatic groups).

The vias may be formed in any desired manner. In the case of one particularly simple design through holes are machined in the coating during the manufacture thereof and such holes are then filled with a conductive material, as for instance a conductive adhesive.

In principle the support body may be provided with its own coating. Since in the form of the piezoelectric body however the relevant components are also encapsulated, a coating-free design of the support body is readily possible as well.

The piezoelectric flexural transducer may as a unimorphous flexural transducer be provided with only one piezoelectric body or as a trimorphous flexural transducer with two encapsulated piezoelectric bodies arranged on opposite longitudinal sides.

To achieve the above mentioned further aim the use of the piezoelectric flexural transducer as a setting member having a drive or sealing function is provided for, for example in conjunction with a valve serving for fluid control. The outer face of the coating may here directly serve as the actuating face and/or sealing face and in this connection may consist of a material with the desired coefficient of friction and/or sealing properties.

In the following the invention will be explained in detail with reference to the accompanying drawings.

DETAILED DESCRIPTION OF THE PREFERRED EMBODIMENTS

Figure 1:
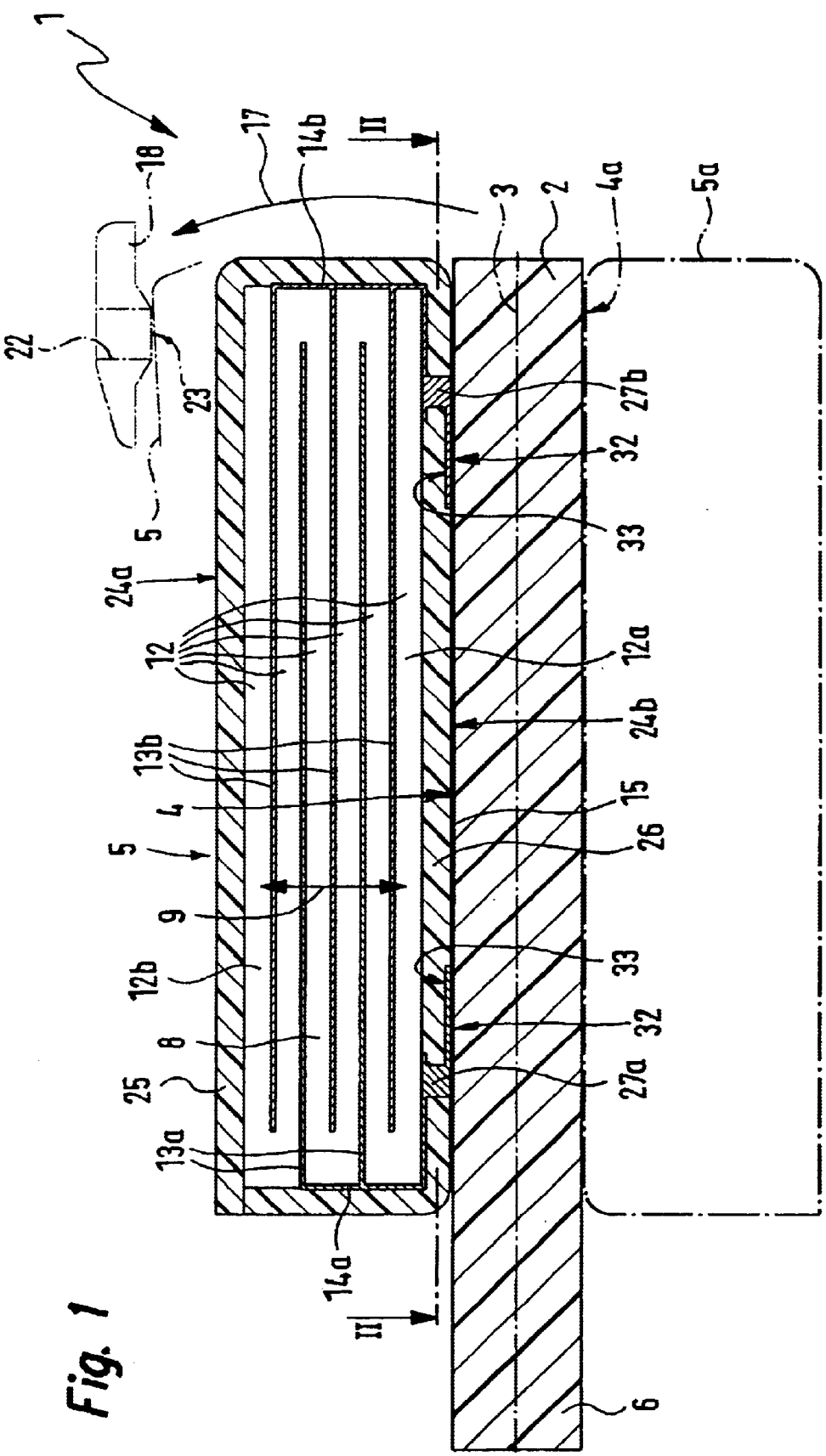
FIG. 1 is a longitudinal section taken through a preferred embodiment of the piezoelectric flexural transducer in accordance with the invention in a highly enlarged view on the section line I—I of FIG. 2.

The piezoelectric flexural transducer generally referenced 1 in FIG. 1 comprises a plate-like, elongated support body 2 having a sheet-like configuration and made in one or more layers. A single layer design is illustrated, which preferably consists of a composite fiber material, for example an epoxy resin which is reinforced with carbon fibers or glass fibers. A further preferred design has a multi-layer structure of plastic, for example polyimide. An electrode structure may be contained in this material.

Such a possible multi-layer design is indicated in FIG. 1 by a chained layer transition or demarcation line 3, same simultaneously indicating the plane of extent of the support body 2.

One of the two outer faces with a large area on the longitudinal sides of the support body 2 is depicted as the first support face 4, which in the front part is provided with a first piezoelectric unit 5. The latter also has an elongated configuration and runs in parallelism to the longitudinal axis of the support body 2, it however preferably being somewhat shorter than the support body 2 so that a connection section 6 of the latter protrudes on the back side past the first piezoelectric unit 5.

The support body 2 is provided with a plurality of electrical conductors extending in its longitudinal direction, such conductors herein being termed first and second electrical conductors 7a and 7b for better comprehension. They run from the terminal portion of the connection section 6 toward the first piezoelectric unit 5 underneath same. At the connection section 6 the first and the second electrical conductors 7a and 7b can be connected in a known manner with a power supply circuit to produce or conduct the drive voltage necessary for the operation of the piezoelectric flexural transducer 1. The first and the second electrical conductors 7a and 7b in the working embodiment run on the first support face 4.

The first piezoelectric unit 5 mounted on the first support face 4 possesses an elongated piezoelectric body 8, which has several piezoelectric material layers 12 extending flatwise and superposed in a stacking direction 9 at a right angle to the plane 3 of extent. The piezoelectric material is for example a suitable piezoelectric ceramic. Between piezoelectric material layers 12 which are directly adjacent in the stacking direction 9 alternating sheet-like first and second electrodes 13a and 13b extend. They may be formed as metallized layers, for example in the form of a silver and/or palladium metallized layer. Apart from the bottom piezoelectric material layer 12a adjacent to the support body 2 and the top piezoelectric material layer 12b opposite to same, which are formed without electrodes on the sides facing away from the multi-layer body, accordingly the piezoelectric material layers 12 are each flanked on opposite sides by a first and a second electrode 13a and 13b.

The first and the second electrodes 13a and 13b project terminally out from the piezoelectric material layers 12, all first electrodes 13a being jointly linked with first electrical contact means 14a, whereas the second electrodes 13b are in contact with second electrical contact means 14b.

With the first piezoelectric unit 5 mounted the first electrical contact means 14a and accordingly the first electrodes 13a are connected with the first conductor 7a of the support body 2. In a similar manner electrical contact is produced between electrodes 13b by way of the second electrical contact means 14b with the second electrical conductor 7b.

The first piezoelectric unit 5 is secured in some suitable way to the first support face 4. In the working embodiment illustrated this is ensured by bonding, an adhesive layer 15 being applied between the bottom side of the first piezoelectric unit 5 and the first support face 4.

If a drive voltage at a suitable level is applied by way of first and the second electrical conductors 7a and 7b to the first and the second electrodes 13a and 13b, electric fields polarized in the stacking direction will be formed within the piezoelectric material layers 12, such fields having the effect that the length dimensions of the piezoelectric material layers 12 as measured in the length direction 16 of the piezoelectric flexural transducer 1 will be become shorter. The result of this is that the piezoelectric flexural transducer 1 will be bowed, this meaning a deflection perpendicularly to the longitudinal direction of the flexural transducer as indicated by the arrow 17. This movement may be employed to perform a drive or sealing function.

In practical use the piezoelectric flexural transducer 1 is held on the rear side, it performing the deflection movement at its front part. The flexural transducer may be held at the connection section 6 and/or in the adjoining rear terminal part of the first piezoelectric unit 5.

A preferred application of the piezoelectric flexural transducer 1 is illustrated in chained lines in FIG. 1. It will be seen that there is here a diagrammatically indicated section of the housing 18 of a valve, which has a fluid duct 22 with a fluid duct opening 23 turned toward the top outer face 24a (facing away from the support body 2) of the first piezoelectric unit 5. The piezoelectric flexural transducer 1 may now be employed for the control of a fluid flow by opening or closing the fluid duct opening 23 dependent on the control state. The piezoelectric flexural transducer 1 consequently here implements a sealing function.

Other applications of the piezoelectric flexural transducer are possible. It may for example perform a drive function, it then acting as a setting member on a component of any type which is to be moved, it again possibly being a question of a valve component.

The piezoelectric body 8 could also have a single layer structure instead of the depicted multi-layer structure, the body 8 then only comprising a single piezoelectric material layer with a correspondingly greater thickness so that the piezoelectric material would have a monolithic structure.

The first piezoelectric unit 5 is furthermore characterized by having an electrically insulating coating 25 surrounding the piezoelectric body on all sides, that is to say completely. All piezoelectric material layers 12 and electrodes 13a and 13b are accordingly encapsulated by a coating as a sort of casing and shut off from the outside surroundings. As a result there is optimum protection against any moisture or other damaging effects.

The piezoelectric body 8 of the piezoelectric unit 5 is furthermore not in direct contact with the support body 2, which is itself best designed free of any coating. For attachment on the support body 2 the above mentioned adhesive layer 15 is applied between the first support face 4 and the bottom outer face 24b, facing it, of the bottom coating section 26 extending between the support body 2 and the piezoelectric body 8.

For making electrical contact between the first and the second electrodes 13a and 13b and the first and second electrical conductors 7a and 7b, provided on the support body 2, the first piezoelectric unit 5 is provided, preferably in the bottom coating section 26, with electrically conductive vias 27a and 27b which extend through the coating 25. Within the space enclosed by the coating 25 they are electrically connected with the first and second contact means 14a and 14b with the correct coordination and outside the first piezoelectric unit 5 they are in electrical contact with the first and second electrical conductors 7a and 7b.

The first and the second vias 27a and 27b are so structured that they provide for a fluid-tight sealing off of the interior space delimited by the coating 25 and containing the piezoelectric body 8. In the working embodiment this is achieved since the coating 25 has through openings 28 at the vias 27a and 27b, such through openings being filled e.g. with a conductive adhesive or an electrically conductive plastic material, the material providing for an autogenous connection with the material of the coating 25.

Since the coating 25 consists of insulating material, and preferably a dielectric material is employed, short circuits or other impairments may be avoided and more particularly additional electrical insulating means are unnecessary as regards of the electrodes 13a and 13b covered over by the coating 25, and of the electrical contact means 14a and 14b.

A coating 25 of a material which has proved particularly suitable is one of parylene polymer film (parylene generically denoting thermoplastic polymer films produced from p-xylene). More particularly, use is made of so-called parylene N (unsubstituted poly-para-xylylene), parylene D (substitution of two aromatic H atoms by two chlorine atoms) or parylene C (substitution of one aromatic H atom by one chlorine atom), the last named material being preferred owing to its electrical and physical properties. More particularly it does possess an extremely low permeability as regards moisture and corrosive gases. Parylene polymers may be produced in the form of structurally continuous, extremely thin layers so that the overall dimensions of the piezoelectric flexural transducer are hardly changed by having the applied coating.

As an alternative to a parylene polymer film consisting of parylene plastic, as a material for the coating 25 it is also possible to employ a polyimide plastic, preferably Kapton as marketed by DuPont.

The manufacture of the plastic coating 25 may for instance be performed as part of a layer deposition process.

In order to ensure that the operation of providing the support body 2 with a piezoelectric unit 5 has as little effect on dimensional tolerances as possible, it is an advantage for each via 27a and 27b to be provided with a contact making layer 32 provided on the bottom outer face 24b, which faces the support body 2, of the coating section 26, such layer 32 being connected with the respective via 27a and 27b, while however having a larger base area than it. The contact making layers 32 are indicated in FIG. 2 by chained lines.

Figure 2:
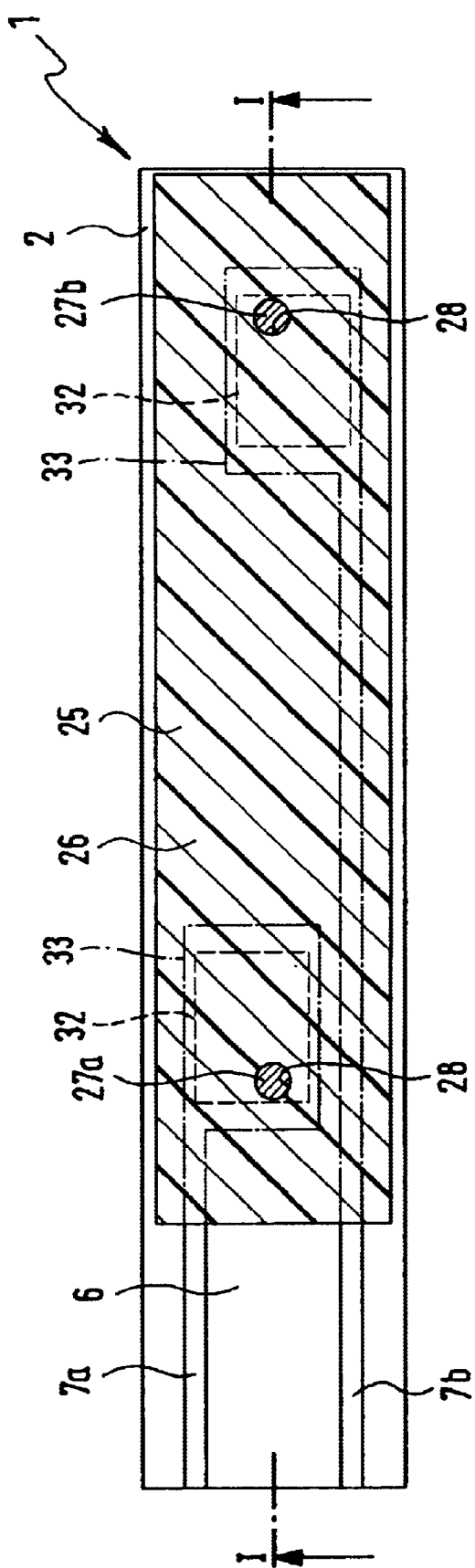
FIG. 2 is a plan view of the piezoelectric flexural transducer of FIG. 1, partly in a longitudinal section taken on the line II—II.

In a similar manner it is an advantage for the first and second electrical conductors 7a and 7b to possess an electrically conductive contact face 33 at the respective vias to make contact with same, such contact face 33 being indicated in FIG. 2 in chained lines. Their base area may with advantage be larger than that of the contact making layer 32 so that the contact making layer 32 may rest with its full area on the associated contact making face 33. The contact making layers 32 may, as well as the contact making faces 33 and all the electrical conductors 7a and 7b, be constituted by a suitable metallized layer.

Since the first piezoelectric unit 5 in the working example includes two electrode groups 13a and 13b and for each electrode group a via 27a and 27b is provided, the first piezoelectric unit 5 accordingly has a small number of only two vias 27a and 27b, which are preferably spaced apart in the longitudinal direction 16 of the support body 2. Dependent on the design of the piezoelectric unit furthermore only one single via 27, or more than two, could be provided.

The piezoelectric flexural transducer 1 in accordance with example has a unimorphous structure with only one piezoelectric unit 5. Nevertheless the invention is naturally applicable to flexural transducers 1 possessing more piezoelectric units. The design of a trimorphous piezoelectric flexural transducer illustrated in FIG. 1 may serve as an example in this respect, the support body 2 having a second support face 4a on the longitudinal side opposite to the first support face 4, the support face 4a being fitted with a second piezoelectric unit 5a (indicated in chained lines).

A further advantage of the piezoelectric flexural transducer 1 is that given a suitable selection of the material for the coating 25 it is possible to dispense with additional components in order to design the contact, necessary for drive and/or sealing purposes, with a counterpart. In this case the outer face of the coating 25 may be directly employed as an actuating and/or sealing face, at which the piezoelectric flexural transducer 1 engages a component to be driven and/or engages a valve seat.

What is claimed is:

1. A piezoelectric flexural transducer comprising an elongated support body which on at least one longitudinal side is fitted with a piezoelectric unit, which has a piezoelectric body with one or more piezoelectric material layers and electrodes associated with same, characterized in that the piezoelectric unit comprises an electrically insulating coating surrounding and encasing the piezoelectric body, such coating being provided with one or more vias for making electric contact with the electrodes.

2. The piezoelectric flexural transducer as set forth in claim 1, characterized in that the vias are arranged in the section of the insulating coating lying between the piezoelectric body and the support body and produce an electrically conductive connection between the electrodes and the support body and, respectively, the electrical conductors of the support body.

3. The piezoelectric flexural transducer as set forth in claim 2, characterized in that at each via support body has an electrically conductive contact face in electrical contact with same.

4. The piezoelectric flexural transducer as set forth in claim 2, characterized in that for each via there is a contact making layer provided on the outer face, facing the support body, of the section, resting against the support body, of the coating, such contact making layer preferably being in the form of a connection track, for making contact with the support body to the electrodes.

5. The piezoelectric flexural transducer as set forth in claim 1, characterized in that the support body has a single or multiple layer design or multiple layer design, the drive voltage being able to be applied by way of electrical conductors of the support body.

6. The piezoelectric flexural transducer as set forth in claim 5, characterized in that the electrical conductors are at least partially arranged in the interior of the multi-layer support body.

7. The piezoelectric flexural transducer as set forth in claim 1, characterized by at least two vias spaced apart in the longitudinal direction of the support body.

8. The piezoelectric flexural transducer as set forth in claim 1, characterized in that the support body comprises a fiber reinforced composite body, which more particularly consists of carbon fiber reinforced or glass fiber reinforced epoxy synthetic resin.

9. The piezoelectric flexural transducer as set forth in claim 1, characterized in that of the support body comprises a polyimide and more particularly has an integrated electrode structure.

10. The piezoelectric flexural transducer as set forth in claim 1, characterized in that the piezoelectric body is designed in the form of a multi-layer piezoelectric body.

11. The piezoelectric flexural transducer as set forth in claim 1, characterized in that the coating of the piezoelectric unit, has dielectric material properties.

12. The piezoelectric flexural transducer as set forth in claim 1, characterized in that the coating comprises a parylene plastic, preferably in the form of a polymer film, and preferably so-called parylene C.

13. The piezoelectric flexural transducer as set forth in claim 1, characterized in that the coating comprises a polymide plastic layer, preferably consisting of so-called Kapton.

14. The piezoelectric flexural transducer as set forth in claim 1, characterized in that the coating is constituted by a plastic layer produced by a layer depositing method.

15. The piezoelectric flexural transducer as set forth in claim 1, characterized in that such via comprises electrically conductive material introduced into a through opening in the coating, such material being for example a conductive adhesive.

16. The piezoelectric flexural transducer as set forth in claim 1, characterized in that the support body is free of coating.

17. The piezoelectric flexural transducer as set forth in claim 1, characterized in that the piezoelectric unit is bonded to the support body.

18. The piezoelectric flexural transducer as set forth in claim 1, characterized in that the support body is fitted with a respective piezoelectric unit on two longitudinal opposite sides.

19. The use of a piezoelectric flexural transducer as set forth in claim 1 as a setting member with at least one of a drive function and a sealing function, the outer faces of its coating being preferably employed directly as at least one of an actuating face and a sealing face.

* * * * *